(12) United States Patent
Sato

(10) Patent No.: US 8,074,130 B2
(45) Date of Patent: Dec. 6, 2011

(54) TEST APPARATUS

(75) Inventor: Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 259 days.

(21) Appl. No.: 12/017,352

(22) Filed: Jan. 22, 2008

(65) Prior Publication Data
US 2008/0201621 A1    Aug. 21, 2008

Related U.S. Application Data

(63) Continuation of application No. PCT/JP2007/052851, filed on Feb. 16, 2007.

(51) Int. Cl.
*G11C 29/00* (2006.01)
*G11C 7/00* (2006.01)

(52) U.S. Cl. ......... 714/723; 714/718; 365/200; 365/201

(58) Field of Classification Search .................. 714/718, 714/719, 723, 732, 735; 365/200, 201
See application file for complete search history.

(56) References Cited

U.S. PATENT DOCUMENTS

| | | | | |
|---|---|---|---|---|
| 5,317,573 A * | 5/1994 | Bula et al. | ...................... | 714/711 |
| 5,566,192 A * | 10/1996 | Moon | ........................... | 714/798 |
| 6,173,238 B1 * | 1/2001 | Fujisaki | ........................ | 702/117 |
| 6,374,378 B1 * | 4/2002 | Takano et al. | .................. | 714/719 |
| 6,910,163 B2 * | 6/2005 | Janik et al. | ..................... | 714/723 |
| 7,107,501 B2 * | 9/2006 | Ohlhoff et al. | ................. | 714/723 |
| 7,370,251 B2 * | 5/2008 | Nadeau-Dostie et al. | ..... | 714/723 |
| 2004/0003337 A1 * | 1/2004 | Cypher | .......................... | 714/763 |

FOREIGN PATENT DOCUMENTS

| | | |
|---|---|---|
| JP | 01-018606 | 4/1989 |
| JP | 1998-125092 | 5/1998 |
| JP | 11-213695 | 8/1999 |
| JP | 3377217 | 2/2003 |
| JP | 2005-037396 | 2/2005 |
| JP | 2007-010605 | 1/2007 |

* cited by examiner

*Primary Examiner* — Jeffrey A Gaffin
*Assistant Examiner* — Daniel McMahon
(74) *Attorney, Agent, or Firm* — Osha • Liang LLP

(57) ABSTRACT

A test apparatus includes a test section that executes testing of each cell of the memory under test, a fail information storage section that stores fail information in a fail memory; a counting section that counts the number of defective cells in each block, a reading request receiving section that receives a request to read the fail information of each cell, a comparing section that compares the number of defective cells in a block to a predetermined reference number, a converting section that, in a case where the number of defective cells exceeds the predetermined reference value, converts a plurality of consecutive pieces of fail information in a response data string into a value indicating defectiveness, and a compressing section that compresses the response data string and returns a compressed response data string.

5 Claims, 6 Drawing Sheets

TEST APPARATUS

CROSS REFERENCE TO RELATED APPLICATION

This is a continuation application of PCT/JP2007/52851 filed on Feb. 16, 2007, the contents of which are incorporated herein by reference.

BACKGROUND

1. Technical Field

The present invention relates to a test apparatus that tests a memory. More particularly, the present invention relates to a test apparatus that stores information concerning defective cells acquired as a result of a test.

2. Related Art

In manufacturing of a semiconductor device, it is essential to use a design (DFM: Design for Manufacturing) that optimizes the efficiency of the manufacturing process in order to enhance yield and decrease cost. For example, when a new semiconductor device manufacturing process is implemented, there are cases where sufficient yield cannot be achieved at a preliminary stage. In such a case, the cause of the insufficient yield is investigated and then a design of a mask pattern of an exposure apparatus is changed or an arrangement of the semiconductor device on a wafer is changed. Such improvements may be required more than once, which can result in the process of investigating the cause of the problem and solving the problem being repeated several times.

Japanese Patent Application Publication No. 1998-125092 is cited as an example of technology that involves testing a flash memory serving as the semiconductor device.

To increase the efficiency of the aforementioned process and begin efficient manufacturing quickly, it is desirable that the investigation of the cause of the problem be made more efficient. To facilitate the investigation of the cause of the problem, conventional test apparatuses for semiconductor devices record the problem arising in the semiconductor device for every memory cell and provide this information to a designer. In a preliminary stage of implementing the manufacturing process, however, there are cases where a block in which the problem arises in only some of the cells and a block in which the problem arises in many of the cells are mixed together in the same semiconductor device. In the block in which the problem arises in only some of the cells, knowing the position of the cells in which the problem arises is helpful in the investigation of the cause of the problem. On the other hand, in the block in which the problem arises in many of the cells, knowing the position of the defective cells is not helpful in investigating the cause of the problem because there are cases where a phenomenon affecting the entire block is the cause of the problem.

Furthermore, because the information concerning the problem of every cell is a large amount of data, it is desirable that the information be compressed and saved. When the cells in which the problem arises are recorded in order of the addresses, however, it is common for the compression ratio of the data compression to decrease when the locations at which the problem arises are many and spread out. In other words, not only is a block with too many problems unhelpful in the investigation of the cause of the problem, but there is also a concern that the storage capacity will be needlessly filled when the information concerning the problem is stored. Therefore, recording the problem of every cell for all the blocks in a uniform manner as described above is not efficient.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a test apparatus that tests a memory under test. The test apparatus includes a test section that executes testing of each cell of the memory under test; a fail information storage section that stores in a fail memory fail information corresponding to each cell of the memory under test that indicates pass/fail of each cell; a counting section that counts a number of defective cells detected in each block for every block in the memory under test; a reading request receiving section that receives a request to read the fail information of each cell included in each block; a comparing section that compares the number of defective cells in a reading target block to a predetermined reference number; a converting section that, in a case where the number of defective cells in the reading target block exceeds the predetermined reference value, converts into a value indicating defectiveness a plurality of consecutive pieces of fail information in a response data string that includes the fail information of each cell in the reading target block to be returned in response to the reading request; and a compressing section that compresses the response data string and returns the compressed response data string.

Furthermore, in the test apparatus, the converting section, in a case where the number of defective cells in the reading target block exceeds the reference number, may output the response data string that indicates that all of the cells in the reading target block are defective. In the test apparatus, the compressing section, in a case where the plurality of consecutive pieces of fail information have the same value, may execute a run length compression that replaces the plurality of consecutive pieces of fail information with information that indicates the value of the fail information and a number of consecutive pieces of fail information.

The test apparatus may further include a block information storage section that stores in the block defect memory block defect information that indicates whether defective cells exist in the block and defect excess information that indicates whether the number of defective cells in the block exceeds the reference number, corresponding to each block in the memory under test. In the test apparatus, the converting section, in a case where the defect excess information that indicates that the number of defective cells in the reading target block exceeds the reference number is stored in the block defect memory, may convert into a value indicating defectiveness the plurality of consecutive pieces of fail information in the response data string that includes the fail information of each cell in the reading target block to be returned in response to the reading request.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
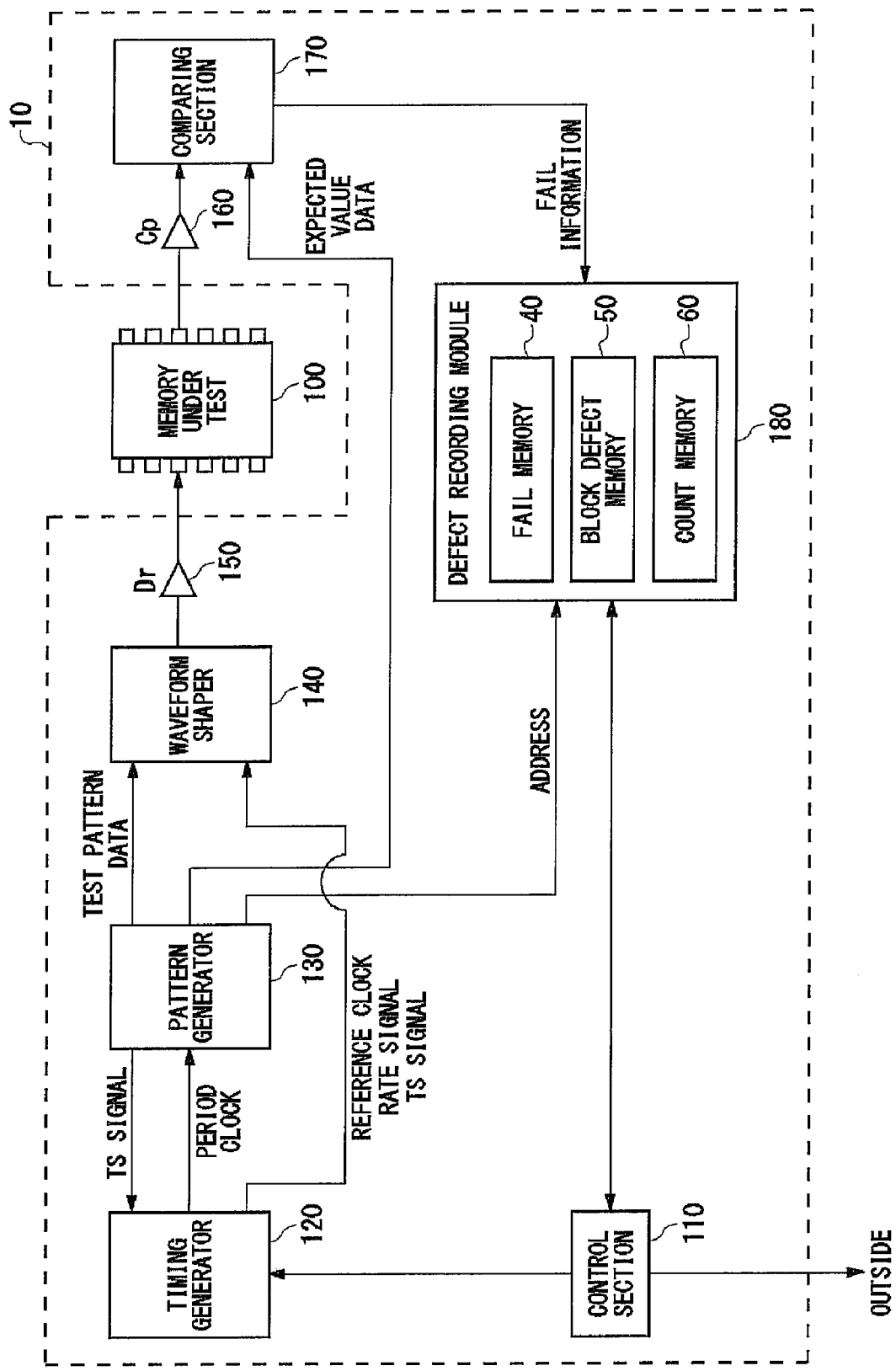
FIG. 1 shows an overall configuration of a test apparatus 10 according to an embodiment of the present invention.

FIG. 1 shows an overall configuration of a test apparatus 10 according to an embodiment of the present invention. The test apparatus 10 is provided with a control section 110, a timing generator 120, a pattern generator 130, a waveform shaper 140, a driver 150, a comparator 160, and a comparing section 170, each working together to operate as test sections according to the present embodiment. The test apparatus 10 is further provided with a defect recording module 180 that acquires a test result and outputs the acquired test result. The timing generator 120 generates a period clock that indicates one cycle of the test and a RATE signal that indicates a start time of a test cycle by using timing data designated by a timing set signal (TS signal) output from the pattern generator 130. The timing generator 120 supplies the period clock to the pattern generator 130 and supplies the RATE signal and the timing clock to the waveform shaper 140.

The pattern generator 130 generates data of a test pattern supplied to the memory under test 100 based on the period clock and supplies the generated data to the waveform shaper 140. The test pattern data includes a test pattern made up of a signal to be supplied to the memory under test 100 for writing a data string onto the memory under test 100 and a test pattern made up of a signal to be supplied to the memory under test 100 for reading the written data string from the memory under test 100. The waveform shaper 140 writes the data string used for testing onto a test target page of the memory under test 100. At this time, the waveform shaper 140 shapes the data string into a waveform to be supplied to the memory under test 100 at an appropriate timing based on timing clock and the RATE signal.

The driver 150 supplies the test pattern data shaped by the waveform shaper 140 to the memory under test 100 as the test pattern signal. The comparator 160 reads the data string used for testing that is written onto the test target page. More specifically, the comparator 160 compares an output signal output by the memory under test 100 in response to the test pattern to a predetermined reference voltage in order to acquire the logic value of the output signal and sets the sequentially acquired logic values to be the data string. The comparing section 170 compares each piece of data included in the data string read from the memory under test 100 in response to the test pattern to an expected value generated in advance by the pattern generator 130. The expected value is the value of the data string written onto the memory under test 100 by the waveform shaper 140.

The defect recording module 180 receives an address from the pattern generator 130. The defect recording module 180 also receives from the comparing section 170 fail information, corresponding to each cell of the memory under test 100, that indicates pass/fail of the cell. The defect recording module 180 includes a fail memory 40 and stores the fail information received from the comparing section 170 in the address in the fail memory 40 corresponding to the address received from the pattern generator 130. In other words, the pattern generator 130 functions as a fail information storage section according to the present invention and sequentially stores fail information in the fail memory 40 by sequentially supplying the addresses of the test targets to the defect recording module 180. Furthermore, the defect recording module 180 includes a block defect memory 50 that stores block defect information. The block defect information indicates whether a defective cell exists in each block. The defect recording module 180 also includes a count memory 60 that stores count information. The count information indicates the number of defective cells included in each block.

The control section 110 instructs each of the aforementioned components to begin the test process described above. For example, the control section 110 causes several test processes to be performed by sequentially instructing the timing generator 120 and, after the aforementioned processes are completed, instructs the defect recording module 180 to read the test results and to output the test results to an external apparatus.

The test apparatus 10 according to the present embodiment outputs a test result in which a portion is omitted that is within a range in which analysis of the cause of the problem occurring in the mask pattern or the manufacturing process is not inhibited by the omission thereof. By doing this, the size of the data that indicates the test result is decreased, which decreases the required capacity of a storage apparatus and the burden placed on a communication network, thereby increasing the efficiency of the analysis of the cause of the problem.

Figure 2:
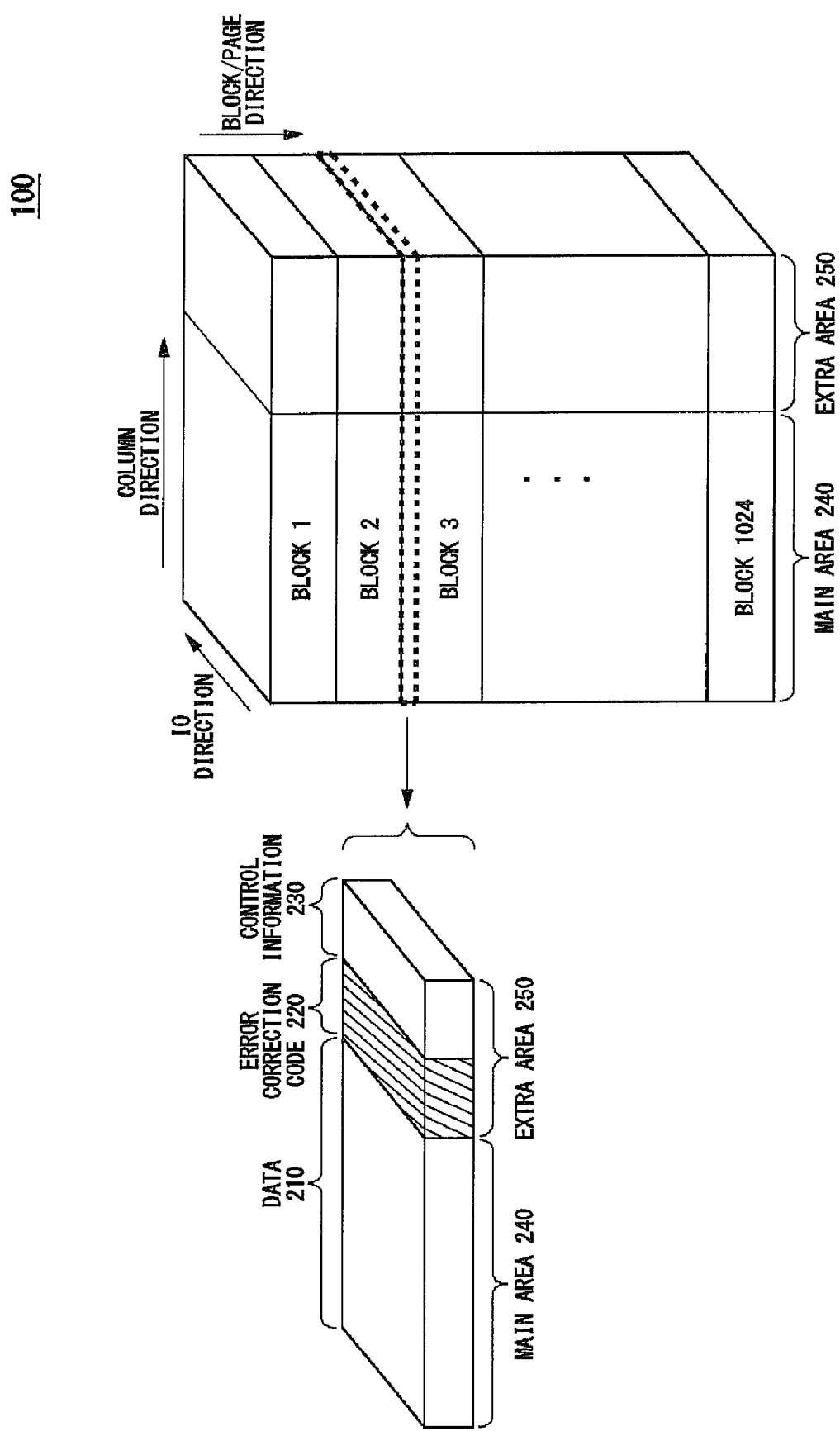
FIG. 2 shows a specific example of an internal configuration of a memory under test 100 according to an embodiment of the present invention.

FIG. 2 shows a specific example of an internal configuration of the memory under test 100 according to an embodiment of the present invention. The memory under test 100 according to the present embodiment is, for example, flash memory serving as a nonvolatile memory device, and the storage region of the memory under test 100 is divided into a plurality of blocks. Each block contains, for example, a data storage capacity of 64 KB and is formed of a plurality of pages, in this case 32 pages, for example. Each block indicates a unit that can be replaced with a backup storage region when a defect occurs. In other words, if each page is replaceable, each block may be configured to include only one page.

The memory under test 100 described as an example in the present embodiment executes reading and writing of the data string with page units that have a data storage capacity of, for example, 2 KB. More specifically, the memory under test 100 includes, for example, a plurality of data IO terminals of 8 bits or the like, and data of one word (e.g., 8 bits) is transmitted for every one input/output cycle via the plurality of data IO terminals. In a single reading or writing process, reading or writing is executed for page units by sequentially transmitting each word in the page in a direction of the columns.

The storage region in the memory under test 100 includes a main area 240 and an extra area 250. The main area 240 is a region that stores data 210 to be stored in the memory under test 100. The extra area 250 is a region that stores error correction code 220 for correcting a bit error that occurs in the data 210 and also stores control information 230 that indicates that use of the page in which the error occurs is prohibited or the like. When a numeric value specified as the control information 230 is stored in the extra area 250, the entire block included in the control information 230 is designated as being unusable and the entire page included in the control information 230 is also designated as being unusable. What type of setting is designated when a certain value is written and what settings are possible are different depending on the specification of the memory under test 100.

Figure 3:
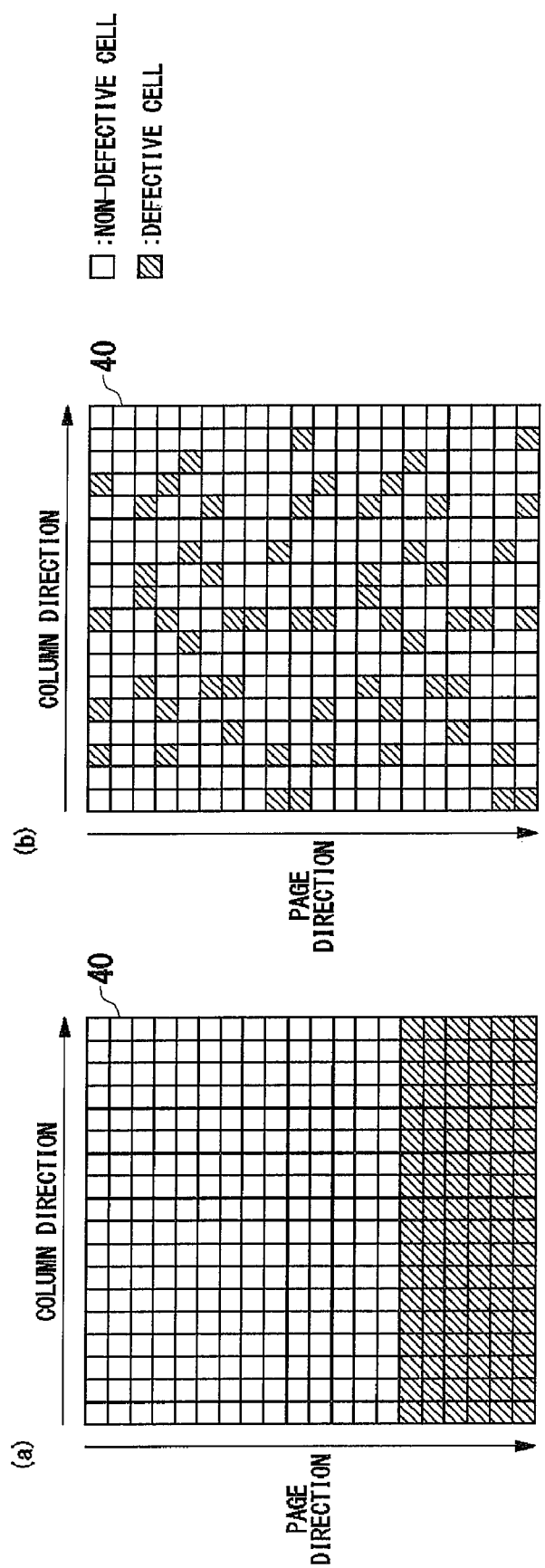
FIG. 3 is an example of fail information recorded in the fail memory 40 of an embodiment of the present invention and shows a comparison between a case in which the fails occur in a concentrated manner and a case in which the fails occur in a dispersed manner.

FIG. 3 is an example of fail information recorded by the fail memory 40 of an embodiment of the present invention and shows a comparison between a case in which the fails occur in a concentrated manner and a case in which the fails occur in a dispersed manner. The horizontal axis represents a column direction, the vertical axis represents a page direction, and the diagonal lines represent the defective cells. A plurality of consecutive address values are allocated to a plurality of memory cells that are consecutive in the column direction. When the defective cells are consecutive in the column direction as shown in FIG. 3(a), the addresses of the defective cells are also consecutive. Because of this, when the data is compressed by, for example, a run length data compression or the like, the data size of the fail information is greatly compressed because the bit data indicating a multitude of consecutive cells is compressed into a very small amount of data that indicates the number of consecutive cells.

On the other hand, when the defective cells are not consecutive in the column direction and the quantity of defective cells is great as shown in FIG. 3(b), the addresses of the defective cells are not consecutive and the quantity of addresses necessary to manage the defective cells becomes large. Because of this, it is difficult to compress the data size of the fail information by, for example, the run length data compression or the like because the number of consecutive cells is low. In this manner, the data size of the fail information is large when a multitude of defective cells exist in a dispersed manner, despite there being cases where the position of the defective cells is not important. To counter this, by using the defect recording module 180 according to the present embodiment, the size of the overall data to be managed can be compressed while keeping the information that is important for analysis of the problem by compressing the fail information in a different format based on the content of the fail information.

Figure 4:
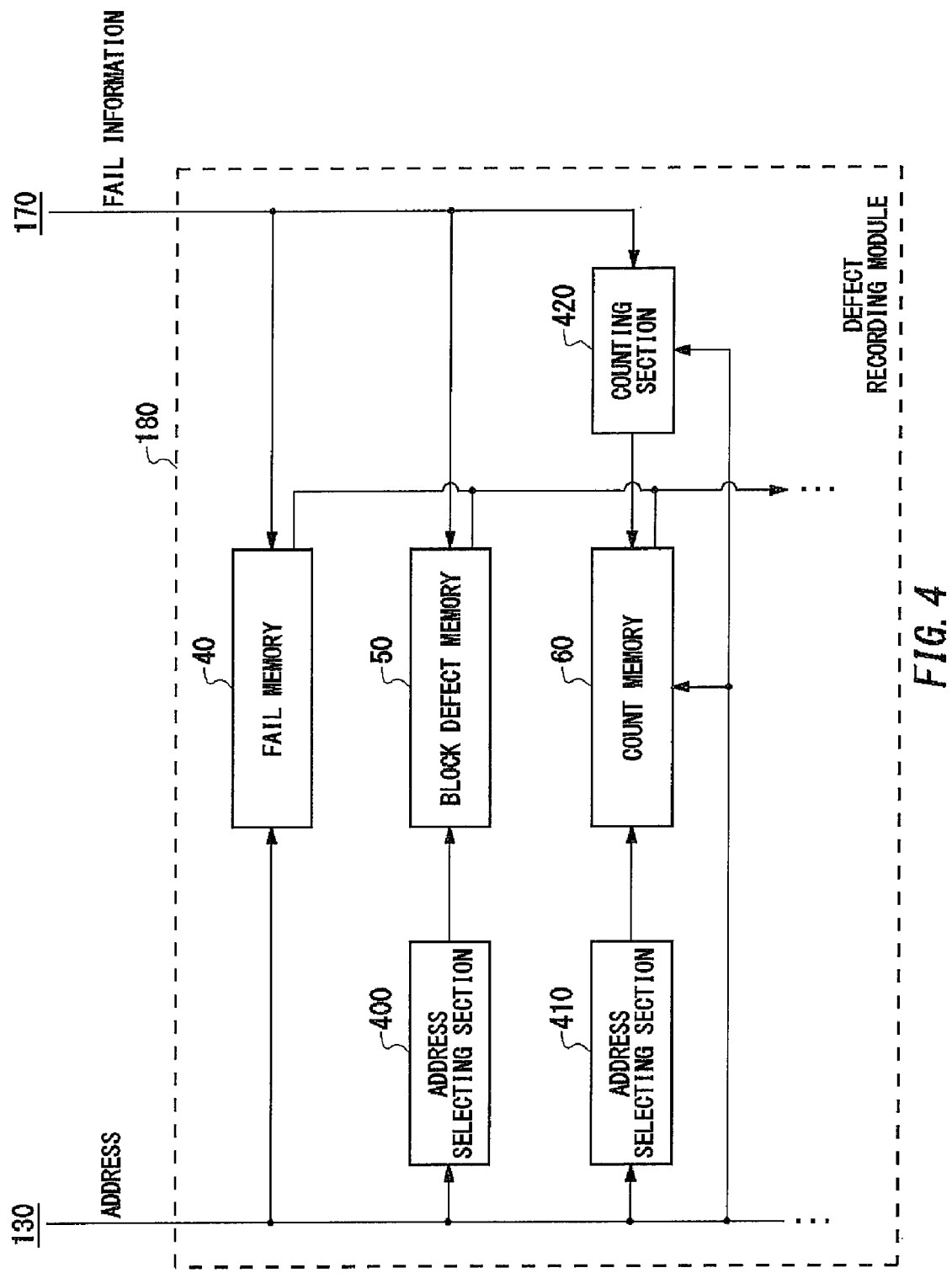
FIG. 4 shows a configuration having a function to store the fail information in a defect recording module 180 according to an embodiment of the present invention.

FIG. 4 shows a configuration having a function to store the fail information in the defect recording module 180 according to the present embodiment. The defect recording module 180 includes the fail memory 40, the block defect memory 50, the count memory 60, an address selecting section 400, an address selecting section 410, and a counting section 420. The fail memory 40 stores fail information corresponding to each memory cell in the memory under test 100 that indicates pass/fail of the corresponding memory cell. More specifically, the fail memory 40 receives an address of a memory cell of a test target from the pattern generator 130 and receives fail information that indicates pass/fail of the memory cell from the comparing section 170. The fail memory 40 stores the received fail information in the address corresponding to the received address.

The address selecting section 400 is an example of a block information storage section according to the present invention. The address selecting section 400 receives an address from the pattern generator 130, generates identification information of the block associated with the memory cell indicated by the received address by masking or the like the lower bits, for example, of the address, and supplies the generated identification information to the block defect memory 50. The block defect memory 50 stores the fail information received from the comparing section 170 in an address corresponding to the received identification information. When the block defect memory 50 has stored fail information indicating that a certain block is defective, the block defect memory 50 continues to store the aforementioned fail information even when fail information indicating that the aforementioned block is non-defective is received thereafter. By doing this, the address selecting section 400 can store in the block defect memory 50 block defect information corresponding to each block that indicates whether defective cells exist in the block.

The address selecting section 410 receives an address from the pattern generator 130, generates identification information of the block associated with the memory cell indicated by the received address by masking or the like the lower bits, for example, of the address, and supplies the generated identification information to the count memory 60. The counting section 420 incrementally increases the count value every time the fail information indicating that a memory cell is defective is received from the comparing section 170. The count memory 60 receives a signal that instructs storage of the count value from the pattern generator 130 every time the testing of a block is completed. The count memory 60, in response to the received signal, stores the count value of the counting section 420 in an address corresponding to the identification information received from the address selecting section 410. In this way, by operating together with the address selecting section 410 and the pattern generator 130, the counting section 420 can count the number of defective cells detected in each block for every block in the memory under test 100.

Figure 5:
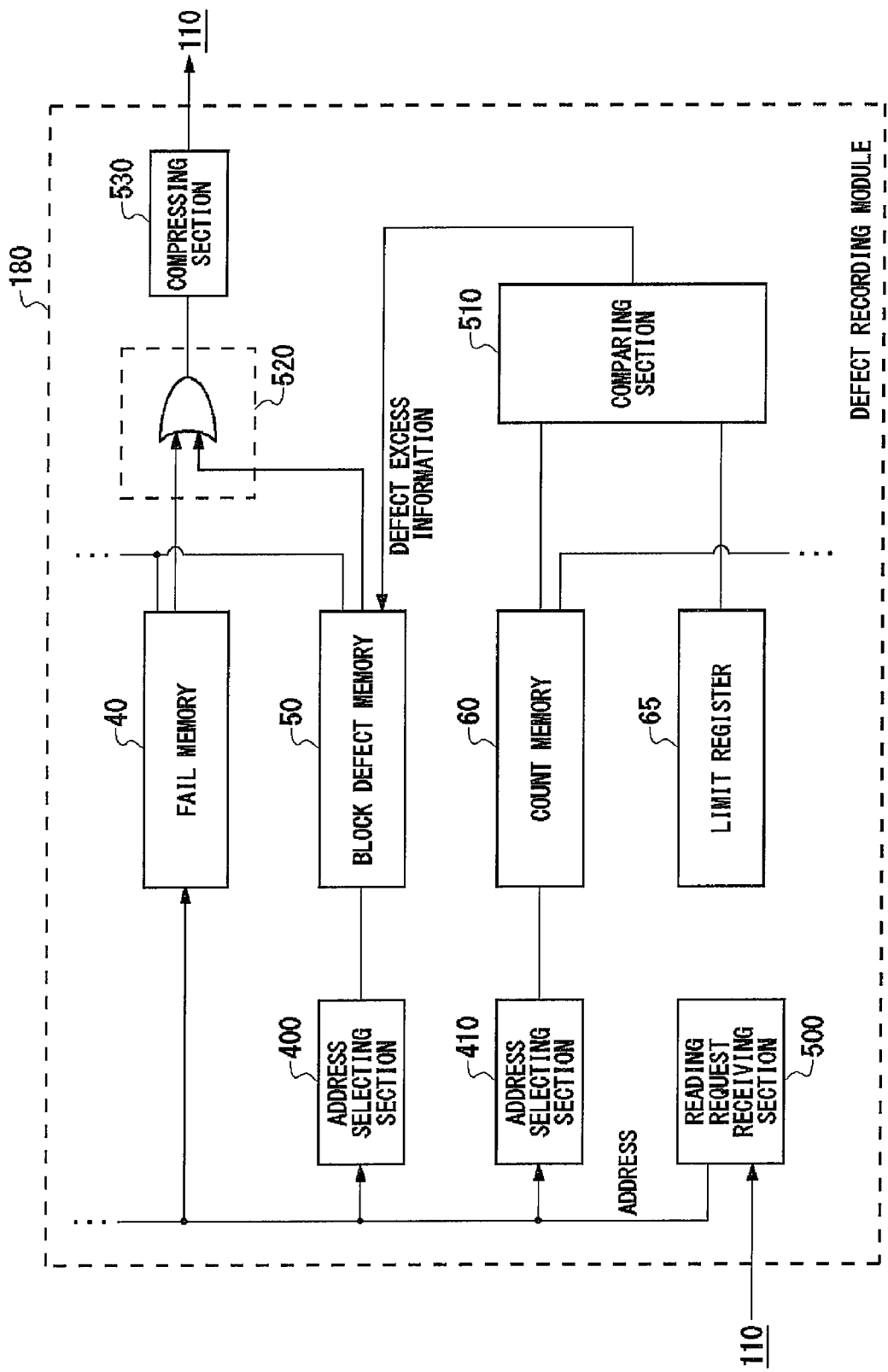
FIG. 5 shows a configuration having a function to read the fail information in the defect recording module 180 according to an embodiment of the present invention.

FIG. 5 shows a configuration having a function to read the fail information in the defect recording module 180 according to the present embodiment. The defect recording module 180 further includes a reading request receiving section 500, a comparing section 510, a converting section 520, and a compressing section 530 in addition to the configuration shown in FIG. 4. As a first stage of a process, the reading request receiving section 500 receives from the control section 110 a request to store in the block defect memory 50 the number of defective cells in each block. In response to the received request, the reading request receiving section 500 sequentially outputs the address of each memory cell in each block to the address selecting section 400 and the address selecting section 410. Furthermore, the reading request receiving section 500 outputs a reading command to the count memory 60 via the address selecting section 410 in association with each address and also outputs a writing command to the block defect memory 50 via the address selecting section 400 in association with each address.

Next, the address selecting section 410 generates identification information of the block associated with the memory cell indicated by the received address by masking or the like the lower bits, for example, of the address, and supplies the generated identification information to the count memory 60. The count memory 60 outputs to the comparing section 510 the defective cell count value stored in the address corresponding to the received identification information. The comparing section 510 compares the number of defective cells in the reading target block to a predetermined reference number. The limit register 65 stores the predetermined reference number. The reference number is a number determined in advance by a user that indicates a number of defects that are unacceptable from the point of view of the problem analysis. The reference number may be changed according to the type of memory under test 100 serving as the test target, the type of test, or the like.

Sequentially output comparison results are stored in the block defect memory 50 as defect excess information that indicates whether the number of defective cells in the block exceeds the reference number. The address selecting section 400 generates identification information of the block associated with the memory cell indicated by the address received by the reading request receiving section 500 by masking or the like the lower bits, for example, of the address, and supplies the generated identification information to the block defect memory 50. By doing this, the address selecting section 400 can store the defect excess information in an address in the block defect memory 50 corresponding to the identification information.

Next, as a second stage of the process, the reading request receiving section 500 receives from the control section 110 a request to read the fail information of each cell included in the block. In response to the received request, the reading request receiving section 500 sequentially outputs the address of each memory cell in each block to the fail memory 40 and the address selecting section 400. Furthermore, the reading request receiving section 500 outputs a reading command to the fail memory 40 in association with each address and outputs a reading command to the block defect memory 50 via the address selecting section 400 in association with each address. It should be noted that reading of the fail memory 40 is not necessary when the number of defective cells exceeds the reference number in all of the blocks of the memory under test 100. In such a case, the reading request receiving section 500 need not output the reading command to the fail memory 40.

The converting section 520 outputs to the compressing section 530 a data string that indicates that all of the cells in a reading target block are defective in a case where the number of defective cells in the reading target block exceeds the reference number. The converting section 520 is achieved by an OR gate or the like, for example. The OR gate outputs to the compressing section 530 a logical sum of the defect excess information read from the block defect memory 50 and the fail information read from the fail memory 40 for each block. Therefore, when defect excess information of a certain block in which the number of defective cells exceeds the reference number (logic value 1) is read from the block defect memory 50, a signal indicating that all of the memory cells are defective is supplied to the compressing section 530, regardless of the content of the fail information supplied from the fail memory 40.

The compressing section 530 compresses the data string output in the manner described above and outputs the compressed data string to the control section 110. For example, the compressing section 530 performs a run length compression on the data string and outputs the thus compressed data string. The run length compression is a compression in which a plurality of consecutive pieces of fail information are replaced with information that indicates a fail information value and a quantity of consecutive pieces of fail information when the plurality of consecutive pieces of fail information have the same value. Accordingly, if all of the memory cells of a certain block are defective, the compression efficiency is extremely high, so that the size of the data string after compression is extremely low. In this manner, the size of the data after compression can be caused to be extremely small by combining the conversion process by the converting section 520 with the run length compression by the compressing section 530.

Furthermore, the process described above stores the defect excess information in the block defect memory 50 during the first stage and compresses the data string based on the stored defect excess information during the second stage, but the two stages can be merged and performed together. For example, the reading request receiving section 500 may sequentially supply each address of each block along with the reading command to both the fail memory 40 and the count memory 60. The converting section 520 does not read the defect excess information from the block defect memory 50, but rather receives as the defect excess information the signals sequentially output from the comparing section 510. By using such a configuration, a region for storing the defect excess information in the block defect memory 50 becomes unnecessary because the defect excess information is output directly from the comparing section 510 to the converting section 520.

Figure 6:
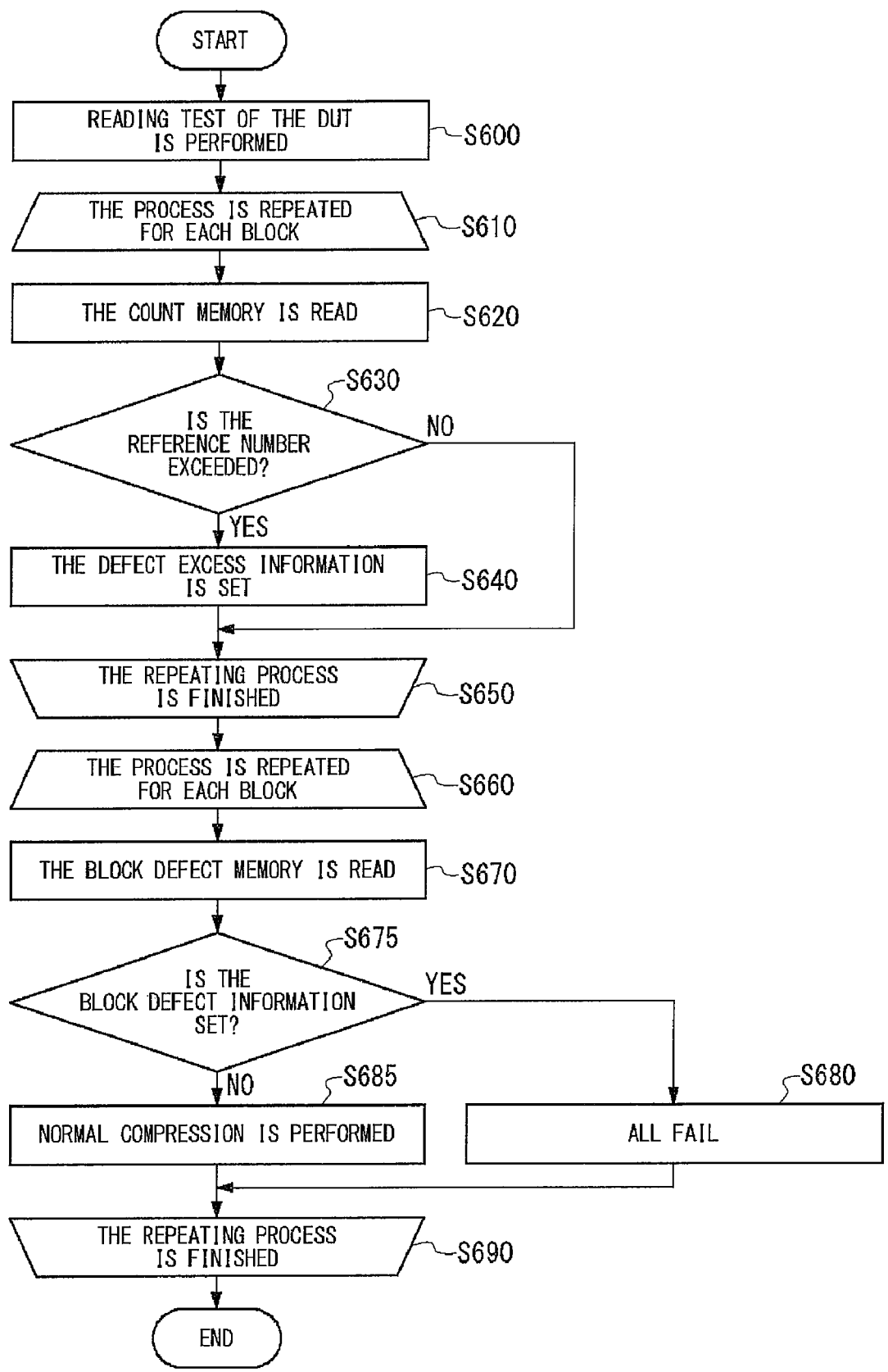
FIG. 6 is a flow chart of the process for reading the fail information by the defect recording module 180 according to an embodiment of the present invention.

FIG. 6 is a flow chart of the process for reading the fail information by the defect recording module 180 according to an embodiment of the present invention. First, the timing generator 120, the pattern generator 130, the waveform shaper 140, the driver 150, the comparator 160, and the comparing section 170 operate together to perform the reading test of the memory under test 100 (S600). More specifically, a test is performed to determine whether the logic value previously stored in each memory cell of the memory under test 100 is read properly and the result of the test is stored in the fail memory 40 as fail information. Next, the test apparatus 10 repeats the process described below for each block (S610). Hereinafter, the process target block will be referred to as "the block."

First, the reading request receiving section 500 causes the address selecting section 410 to read from the count memory 60 the count value that indicates the number of defective cells included in the block (S620). In a case where the number of defective cells exceeds the predetermined reference number (S630:YES), the comparing section 510 stores the defect excess information indicating that the number of defective cells exceeds the predetermined reference number in the block defect memory 50 in association with the block defect information of the block (S640). The defect excess information has a logic value of one, for example. The above process is repeated for each block (S650).

Next, the test apparatus 10 repeats the following process for each block (S 660). First, the reading request receiving section 500 causes the address selecting section 400 to read from the block defect memory 50 the defect excess information that is stored in association with the block defect information of the block (S670). In a case where the defect excess information has a logic value of one, which indicates that the number of defective cells is greater than the reference number (S675:YES), the converting section 520 outputs a data string that indicates that all of the cells in the block are defective (S680). The compressing section 530 receives the data string, compresses the received data string, and returns the compressed data string.

In the above description, a block is the unit that is converted to when all of the cells are defective, but the unit may be a portion of a block. More specifically, when the number of defective cells in a block exceeds the reference number, the converting section 520 may convert the plurality of consecutive pieces of fail information in the response data string to be returned to the control section 110 into a value indicating defectiveness in response to the reading request. In other words, the response data string is the fail information of each memory cell in a block, but may also be a portion of the fail information that is the conversion target.

On the other hand, when the defect excess information has a logic value of zero, which indicates that the number of defective cells is less than or equal to the reference number (S675:NO), the converting section 520 outputs the fail information to the compressing section 530 without converting the fail information and the compressing section 530 compresses the fail information and returns the compressed fail information (S685). The test apparatus 10 repeats the above process for each block (S690).

As made clear from the above, through the embodiments of the present invention, a test apparatus is realized that does not uniformly execute the same data compression for all of the blocks in the memory under test 100, but rather performs data compression of all of the defective cells for only blocks that are not helpful in defect analysis and that are not expected to have sufficient compression efficiency. By doing this, the analysis of the cause of the problem can be more efficient and computation resources for storing or sending the information concerning the problem can be conserved, even in a condition where the problem is likely to occur immediately after implementation of the manufacturing process.

While the embodiments of the present invention have been described, the technical scope of the invention is not limited to the above described embodiments. It is apparent to persons skilled in the art that various alterations and improvements can be added to the above-described embodiments. For example, the defect excess information may be used for a repair process. Specifically, the test apparatus 10 may perform a process that replaces a block in which the number of defective cells exceeds the reference number with a backup block disposed in the same memory under test 100. It is also apparent from the scope of the claims that the embodiments added with such alterations or improvements can be included in the technical scope of the invention.

What is claimed is:

1. A test apparatus that tests a memory under test, comprising:
   a test section that executes testing of each cell of the memory under test;
   a fail information storage section that stores fail information corresponding to each cell of the memory under test that indicates pass/fail of the cell in a fail memory;
   a counting section that counts a number of defective cells detected in each block for every block in the memory under test, a block being a unit that can be replaced with a backup storage region when a defect occurs;
   a reading request receiving section that receives a reading request to read the fail information corresponding to each cell included in a reading target block;
   a comparing section that compares the number of defective cells in the reading target block to a predetermined reference number and outputs a comparison result;
   a converting section that receives the read fail information and the comparison result and outputs modified fail information, of the same size as the read fail information, in which, in a case where the number of defective cells in the reading target block exceeds the predetermined reference number, one or more pieces of fail information indicating pass among the read fail information are converted into fail information indicating fail; and
   a compressing section that compresses the modified fail information and returns the compressed fail information.

2. The test apparatus according to claim 1, wherein the converting section, in a case where the number of defective cells in the reading target block exceeds the predetermined reference number, outputs modified fail information that indicates that all of the cells in the reading target block are defective.

3. The test apparatus according to claim 2, wherein the compressing section, in a case where the modified fail information includes a plurality of consecutive pieces of fail information having the same value, executes a run length compression that replaces the plurality of consecutive pieces of fail information with information that indicates the value of the plurality of consecutive pieces of fail information and the number of consecutive pieces of fail information.

4. The test apparatus according to claim 1, further comprising a block information storage section that stores, corresponding to each block in the memory under test, block defect information that indicates whether defective cells exist in a block and defect excess information that indicates whether the number of defective cells in the block exceeds the predetermined reference number wherein
   the converting section, in a case where the defect excess information indicates that the number of defective cells in the reading target block exceeds the reference number, outputs modified fail information that indicates that all of the cells in the reading target block are defective.

5. The test apparatus according to claim 1, wherein the converting section, in a case where the number of defective cells in the reading target block does not exceed the predetermined reference number, outputs modified fail information that is the same as the read fail information.

* * * * *